(12) United States Patent
Namai

(10) Patent No.: US 8,675,407 B2
(45) Date of Patent: Mar. 18, 2014

(54) SEMICONDUCTOR MEMORY DEVICE

(75) Inventor: Yuzuru Namai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 13/249,981

(22) Filed: Sep. 30, 2011

(65) Prior Publication Data

US 2012/0081960 A1    Apr. 5, 2012

(30) Foreign Application Priority Data

Sep. 30, 2010 (JP) ................................ 2010-223208

(51) Int. Cl.
*G11C 16/04* (2006.01)

(52) U.S. Cl.
USPC ............ 365/185.11; 365/185.12; 365/185.23; 365/230.03; 365/230.06

(58) Field of Classification Search
USPC .............. 365/185.11, 185.12, 230.03, 230.06
See application file for complete search history.

(56) References Cited

U.S. PATENT DOCUMENTS

| | | | |
|---|---|---|---|
| 7,382,651 B2* | 6/2008 | Nagao et al. ............. | 365/185.11 |
| 2005/0036395 A1* | 2/2005 | Maejima et al. ............. | 365/232 |
| 2005/0094428 A1* | 5/2005 | Futatsuyama et al. ........ | 365/145 |
| 2005/0207247 A1* | 9/2005 | Honda et al. ................ | 365/202 |
| 2008/0101128 A1* | 5/2008 | Kim .......................... | 365/185.25 |
| 2009/0006932 A1 | 1/2009 | Brian et al. | |

FOREIGN PATENT DOCUMENTS

JP    2005-025824    1/2005

* cited by examiner

*Primary Examiner* — Toan Le
(74) *Attorney, Agent, or Firm* — Oblon, Spivak, McClelland, Maier & Neustadt, L.L.P.

(57) ABSTRACT

A semiconductor memory device includes a plurality of memory cell data holding transistors provided in each block; a row decoder including transfer transistors, a voltage controller and a block selector in each block, the transfer transistors electrically connected to respective of the memory cell transistors, the voltage controller connected to gates of the respective transfer transistors and transferring a desired voltage to the gates of the respective transfer transistors, the block selector electrically connected to gates of the respective transfer transistors and configured to select blocks. A voltage generator generates the voltage to be supplied to the transfer transistors; and a controller controls the row decoder and the voltage generator circuit. When data is written, the gates of the respective transfer transistors are connected to the voltage controller in each non-selected block, and the gates of the respective transfer transistors are disconnected from the voltage controller in each selected block.

18 Claims, 3 Drawing Sheets

US 8,675,407 B2

SEMICONDUCTOR MEMORY DEVICE

CROSS-REFERENCE TO RELATED APPLICATIONS

This application is based upon and claims the benefit of priority from the prior Japanese Patent Application No. 2010-223208 filed Sep. 30, 2010, the entire contents of which are incorporated herein by reference.

FIELD

Embodiments described herein relate generally to a semiconductor memory device, for example, an electrically erasable programmable nonvolatile semiconductor memory device.

BACKGROUND

For example, electrically erasable programmable nonvolatile semiconductor memories using a floating gate electrode which is a charge storage layer are among a variety of nonvolatile semiconductor memory devices. NAND flash memories are known as typical nonvolatile semiconductor memories, and there has been an increasing demand for the NAND flash memories as data storage devices (see Japanese Patent Application Publication No. 2005-25824, for example).

DETAILED DESCRIPTION

Figure 1:
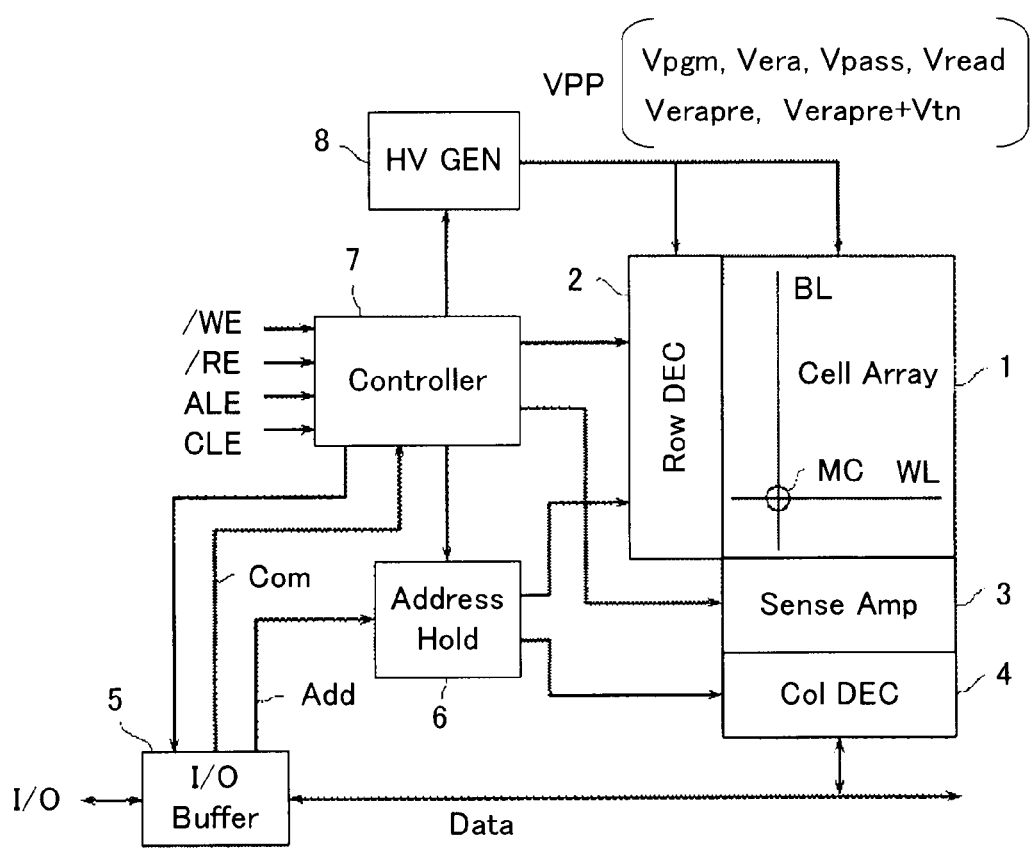
FIG. 1 is a function block diagram of a NAND flash memory of a first embodiment.

In general, according to one embodiment, a semiconductor memory device includes:
plural memory blocks, each including;
a plurality of memory cell transistors provided in each block, and configured to be capable of holding data;
a row decoder including transfer transistors, a voltage controller and a block selector in each block, the transfer transistors respectively electrically connected to the memory cell transistors, the voltage controller connected to gates of the respective transfer transistors and configured to be capable of transferring a desired voltage to the gates of the respective transfer transistors, the block selector electrically connected to gates of the respective transfer transistors and configured to select blocks;
a voltage generator configured to generate the voltage to be supplied to the transfer transistors; and
a controller configured to control the row decoder and the voltage generator circuit, wherein
when data is written, the gates of the respective transfer transistors are connected to the voltage controller in each non-selected block, and the gates of the respective transfer transistors are disconnected from the voltage controller in each selected block.

First Embodiment

Next, referring to the drawings, descriptions will be provided for a first embodiment. For explanatory convenience, the same components will be denoted by the same reference signs throughout the drawings. In addition, dimensional ratios are not limited to those shown in the drawings.

[Constitution of Semiconductor Memory Device]

Descriptions will be provided for a semiconductor memory device of a first embodiment by use of the block diagram shown in FIG. 1. A NAND flash memory exemplifying the semiconductor memory device will be described for explanatory convenience.

The semiconductor memory device includes: a memory cell array 1, a row decoder 2, a sense amplifier circuit 3, a column decoder 4, an input/output buffer 5, an address holding circuit 6, a control circuit 7, and a voltage generator circuit 8.

<<Memory Cell Array>>

Figure 2:
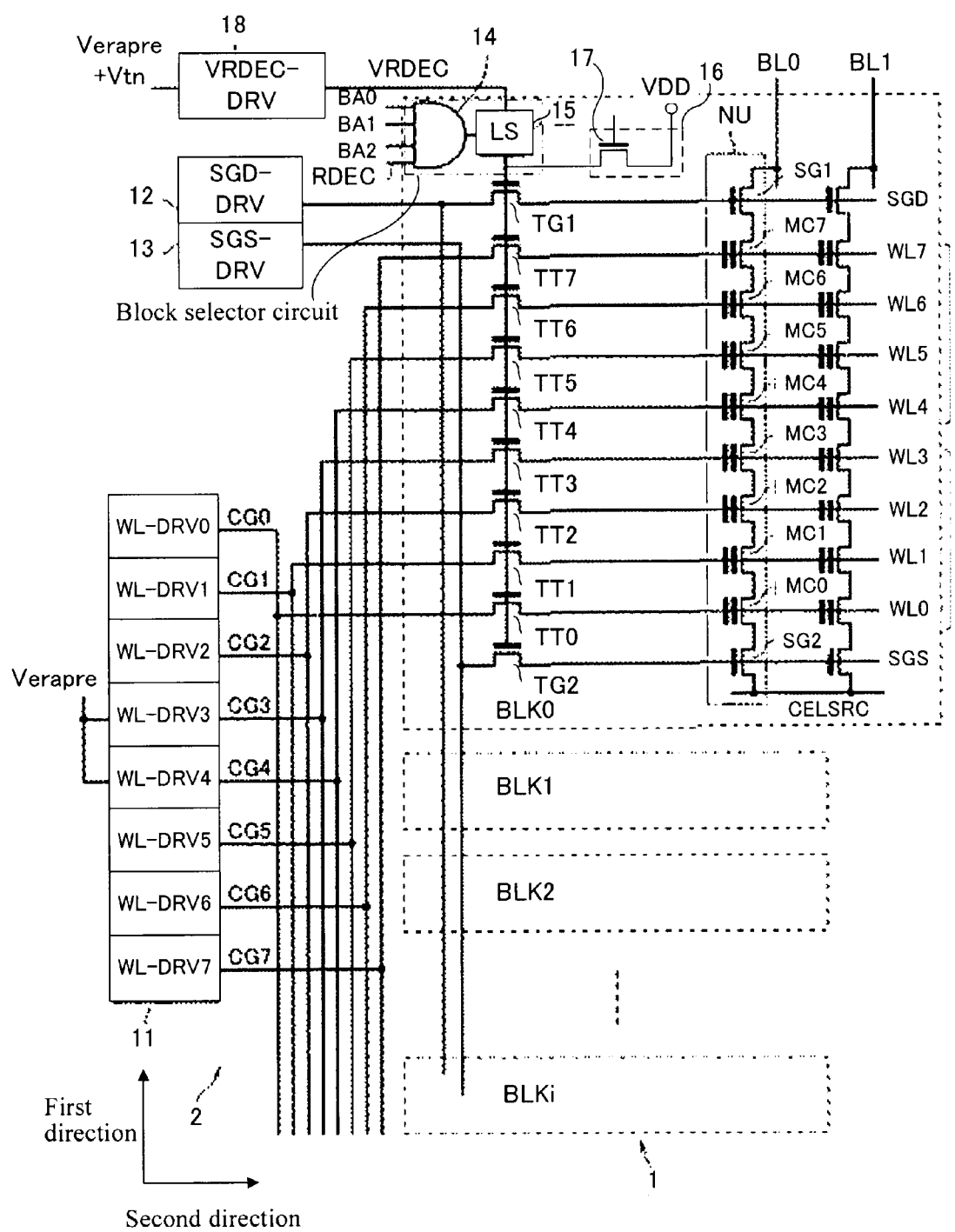
FIG. 2 is a circuit diagram showing a constitution of a memory cell array, a row decoder and voltage control circuits included in the NAND flash memory of the first embodiment.

As shown in a circuit diagram of FIG. 2, the memory cell array 1 is formed from multiple NAND strings NU which are arrayed in matrix.

Multiple bit lines BL0, BL1 are placed extending in a direction as do the respective NAND strings NU (hereinafter referred to as a "first direction"). The bit lines BL0, BL1 are placed above the respective NAND strings NU on a semiconductor substrate (whose illustration is omitted). Each bit line is electrically connected to the end portions of the corresponding NAND string NU. Although two bit lines BL are provided there in FIG. 2, the number of bit lines is not limited to the two, and any other multiple number of bit lines may be provided.

Meanwhile, multiple word lines WL0 to WL7 extend in a direction orthogonal to the first direction in which the NAND strings NU extend (hereinafter referred to as a "second direction"), and are placed one after another at predetermined intervals in the first direction. In this respect, the first direction is also a direction in which active regions (whose illustrations are omitted) extends. Although the 8 word lines are provided there in FIG. 2, the number of word lines is not limited to the 8, and any other multiple number of word lines may be provided.

Multiple selection gate lines SGS, SGD are placed in parallel outside the respective word lines WL0, WL7 with the multiple word lines WL0, WL7 interposed between the selection gate electrodes SGS, SGD.

Each NAND NU includes multiple memory cells MC0 to MC7, as well as first and second selection gate transistors SG1, SG2.

The multiple memory cells MC0 to MC7 are formed in locations corresponding to intersections between the word lines WL and the corresponding bit line, and are connected together in series in the direction in which the active regions extend (i.e., in the first direction).

Each memory cell MC has a stacked gate structure which includes: a charge storage layer formed above the semiconductor substrate with a gate insulating film interposed in between; and a control gate formed above the charge storage layer with an inter-gate insulating film interposed in between. Of course the number of memory cells MC is not limited to the 8, but may be any one of 16, 32, 128, 256 and the like. No restriction is imposed on the number of memory cells MC. Furthermore, each memory cell MC may have a MONOS (Metal Oxide Nitride Oxide Silicon) structure using a scheme to trap electrons in a nitride film.

As shown in FIG. 2, the first selection gate transistor SG1 closer to the bit line BL is connected to the memory cell MC7 in series, while the second selection gate transistor SG2 closer to a source line SL is connected to the memory cell MC0 in series. The source line SL is commonly connected to each NAND string NU.

As shown in FIG. 2, in the NAND strings NU, respectively, the control gates of each corresponding memory cells MC arranged in the second direction are connected to one common word line WL. In addition, the control gates of the corresponding first selection gate transistors SG1 arranged in the second direction are connected to the first selection gate line SGD, while the control gates of the corresponding second selection gate transistors SG2 arranged in the second direction are connected to the second selection gate line SGS.

The multiple NAND strings NU are formed in a matrix within the memory cell array 1. A set of memory cells MC in the respective NAND strings NU, which share one word line WL, constitutes a page which is a data read unit or a data write unit. In addition, a set of multiple NAND strings NU sharing the word lines WL constitutes a block BLK which is a data erase unit.

<<Row Decoder>>

The row decoder 2 is configured to select desired word lines WL in the memory cell array 1. As shown in FIG. 2, the row decoder 2 includes: a word line driver circuit (WL-DRV) 11 commonly used for all the blocks BLK; a selection gate line driver circuit (SGD-DRV) 12 configured to drive the first selection gate lines SGD; and a selection gate line driver circuit (SGS-DRV) 13 configured to drive the second selection gate lines SGS.

The word line driver circuit 11 includes drivers WL-DRV0 to WL-DRV7. The number of drivers WL-DRV0 to WL-DRV7 corresponds to the number of word lines in each block. Output terminals CG0 to CG7 of the respective drivers WL-DRV0 to WL-DRV7 are respectively connected to transfer transistors TT0 to TT7 included in each block BLK. In addition, the selection gate line driver circuits 12, 13 include their respective drivers SGD-DRV, SGS-DRV. Output terminals of the respective selection gate line driver circuits 12, 13 are respectively connected to transfer transistor TG1, TG2.

A desired voltage is supplied to the output terminals CG0 to CG7 and the like from the corresponding drivers. In a selected block, this desired voltage is transferred to the word lines WL and the selection gate lines SGD, SGS through the transfer transistors TT0 to TT7, TG1, TG2, respectively. Thereby, a drive current is supplied to the word lines WL and the selection gate lines SGD, SGS.

The blocks each have a block decoder (included in a block selector circuit) 14, a level shifter (included in the block selector circuit) 15 connected to the output terminal of the block decoder 14, and the multiple transfer transistors TT0 to TT7, TG1, TG2 to be selected and driven by the block decoder 14, for the purpose of supplying a drive voltage from the driver circuits 11 to 13 to the word lines WL0 to 7 and the selection gate lines SGD, SGS included in a selected block.

As shown in FIG. 2, each block has a voltage control circuit 16 which is connected to the gates of the respective transfer transistors.

In this respect, the voltage control circuit 16 includes a voltage control transistor 17. The drain of the voltage control transistor 17 is commonly connected to the gates of all the transfer transistors TT0 to TT7, TG1, TG2 in the block BLK and the output terminal of the level shifter 15. The source of the voltage control transistor 17 is connected to, for example, a power supply voltage Vdd. The gate of the voltage control transistor 17 is supplied with a voltage corresponding to an "L" state or an "H" state of the voltage control transistor 17 from the voltage control circuit 16. This voltage is outputted by controlling the voltage control circuit on the basis of an internal timing signal from the control circuit 7. Incidentally, in FIG. 2, these components are shown in each area indicated by a dashed line, which represents the block BLK.

In each selected block BLK, on the basis of a signal from the block decoder 14, the level shifter 15 converts the level of a high voltage VRDEC outputted from a transfer transistor driver (VRDEC-DRV) 18, and supplies a resultant voltage to the gates of the respective transfer transistors TT0 to TT7, TG1, TG2 in the selected block BLK. Thereby, the transfer transistors TT0 to TT7, TG1, TG2 turns into the "H" state, and a desired voltage (for example, a program voltage) is transferred to the word lines WL, and the selection gate lines SGD, SGS.

Otherwise, in the selected block BLK, a voltage for turning the voltage control transistor 17 into the "L" state is inputted into the gate of the voltage control transistor 17. As a result, the voltage control transistor 17 is cut off, and no power supply voltage Vdd is transferred to the gates of the respective transfer transistors TT0 to TT7, TG1, TG2.

On the other hand, in each unselected block BLK, the high voltage VRDEC outputted from the transfer transistor driver (VRDEC-DRV) 18 is not supplied to the transfer transistors TT0 to TT7, TG1, TG2 through the level shifter 15 because the block BLK is not selected by the block decoder 14.

Moreover, in the unselected block BLK, a voltage for turning the voltage control transistor 17 into the "H" state is inputted into the gate of the voltage control transistor 17. As a result, the power supply voltage Vdd is transferred to the gates of the respective transfer transistors TT0 to TT7, TG1, TG2.

<<Sense Amplifier Circuit, Column Decoder, and Input/Output Buffer>>

The sense amplifier circuit 3 shown in FIG. 1 includes: a sense amplifier (not shown) capable of sensing one page of data; and a data holding circuit i.e., a latch circuit (not shown). Thereby, the sense amplifier circuit 3 constitutes a page buffer for writing and reading data per page in the memory cell array 1.

When data is read, the sense amplifier circuit 3 senses and amplifies one page of data to be read from the memory array 1, and temporarily holds the one page of data. This one page of data is selected by the column decoder 4, and is outputted to an external input/output terminal (denoted by reference sign I/O in FIG. 1) via the input/output buffer 5.

On the other hand, when data is written, a page of data to be inputted from the external input/output terminal is selected by the column decoder 4, and is inputted into the sense amplifier circuit 3. This data is held by the sense amplifier circuit, until a write is completed in accordance with a step-up scheme, for example. An address signal is inputted into the address holding circuit 6 via the input/output butter 5. In addition, the address signal is outputted from the address holding circuit 6 into the row decoder 2 and the column decoder 4.

<<Control Circuit>>

On the basis of external control signals such as a write enable signal /WE, a read enable signal /RE, an address latch enable signal ALE and a command latch enable signal CLE, the control circuit 7 outputs various internal timing signals for controlling the timing of data read, the timing of data write, and the timing of data erase.

Furthermore, on the basis of these internal timing signals, the control circuit 7 controls a data read operation, as well as a sequence for a data write operation and a data erase operation.

The control circuit 7 outputs the internal timing signals to the row decoder 2, a voltage generator circuit 8 and the like. Thereby, the control circuit 7 controls, for example, the block decoders 14 in the row decoder 2, and classifies the blocks into selected blocks and unselected blocks.

By this, the level of the high voltage VRDEC outputted from the transfer transistor driver 18 is converted, and the resultant voltage is supplied to the transfer transistors TT0 to TT7, TG1, TG2 in the selected blocks BLK. On the other hand, the high voltage VRDEC outputted from the transfer transistor driver 18 is not supplied to the transfer transistors TT0 to TT7, TG1, TG2 in the unselected blocks.

In addition, the control circuit 7 supplies a desired voltage to the gate of the voltage control transistor 17 in each block by outputting the internal timing signals to the voltage generator circuit 8.

<<Voltage Generator Circuit>>

The voltage generator circuit 8 is controlled by the internal timing signals outputted from the control circuit 7, and thus generates various voltages used to perform operations such as a data write operation and a data erase operation. Subsequently, the voltage generator circuit 8 outputs the thus-generated voltages to, for example, the row decoder 2. The voltages generated by the voltage generator circuit 8 are applied to the word lines WL.

[Effects of First Embodiment]

Employing the above-described configuration, the embodiment can provide a semiconductor memory device having first various advantages as next discussed.

The semiconductor memory device of the embodiment has the voltage control circuit 16 in each block BLK. This voltage control circuit 16 is connected to the gates of the respective transfer transistors TT0 to TT7, TG1, TG2. When data is written, the desired voltage (for example, the power supply voltage Vdd) can be transferred to the gates of the respective transfer transistors TT0 to TT7, TG1, TG2 by turning the voltage control transistor into the "H" state in each unselected block.

For this reason, in a case where this desired voltage is the power supply voltage Vdd, the difference in voltage between the gate and source of each of the transfer transistors TT0 to TT7, TG1, TG2 in each unselected block BLK is Vpgm−Vdd at maximum. This voltage difference occurs because a voltage Vpgm is applied to the sources of the transfer transistors TT0 to TT7, TG1, TG2 in the unselected block BLK, which share the output terminals CG corresponding to the word lines WL to be programmed in the selected blocks BLK.

Meanwhile, in a semiconductor memory device not provided with the voltage control circuit of the embodiment, the difference in voltage between the gate and source of each of the transfer transistors TT0 to TT7, TG1, TG2 in each unselected block BLK is Vpgm at maximum. That is because the ground potential is applied to the gates of the respective transfer transistors TT0 to TT7, TG1, TG2.

Thus, when data is written, the gates of the respective transfer transistors (TT1-TT7, TG1, TG2) are connected to the voltage controller 16 in each non-selected block, and the gates of the respective transfer transistors (TT1-TT7, TG1, TG2) are disconnected from the voltage controller 16 in each selected block. When data is written, in each non-selected block, the control circuit 7 turns on a transistor 17. So, a voltage of transfer transistors (TT1-TT7, TG1, TG2) becomes VDD. Accordingly, the semiconductor memory device of the embodiment is featured in that the difference in voltage between the gate and source of each transfer transistor in each unselected block is lower than the semiconductor memory device provided with no voltage control circuit. That is, in this embodiment, the difference in voltage between the gate and source of transfer transistor is Vpgm−Vdd at maximum. On the other side, in the semiconductor memory device provided with no voltage control circuit, the difference in voltage between the gate and source of transfer transistor is Vpgm(=Vpgm−0) at maximum. Note that transfer transistors (TT1-TT7, TG1, TG2) are not turned on, but remain in the OFF state, even if a voltage of transfer transistors (TT1-TT7, TG1, TG2) becomes VDD. For this reason, the semiconductor memory device of the embodiment is capable of reducing a threshold value variation which takes place in the transfer transistors due to hot carrier trapping.

As a result, the semiconductor memory device of the embodiment is capable of preventing a malfunction of the transfer transistors, and of enhancing the reliability of the transfer transistors.

Second Embodiment

Figure 3:
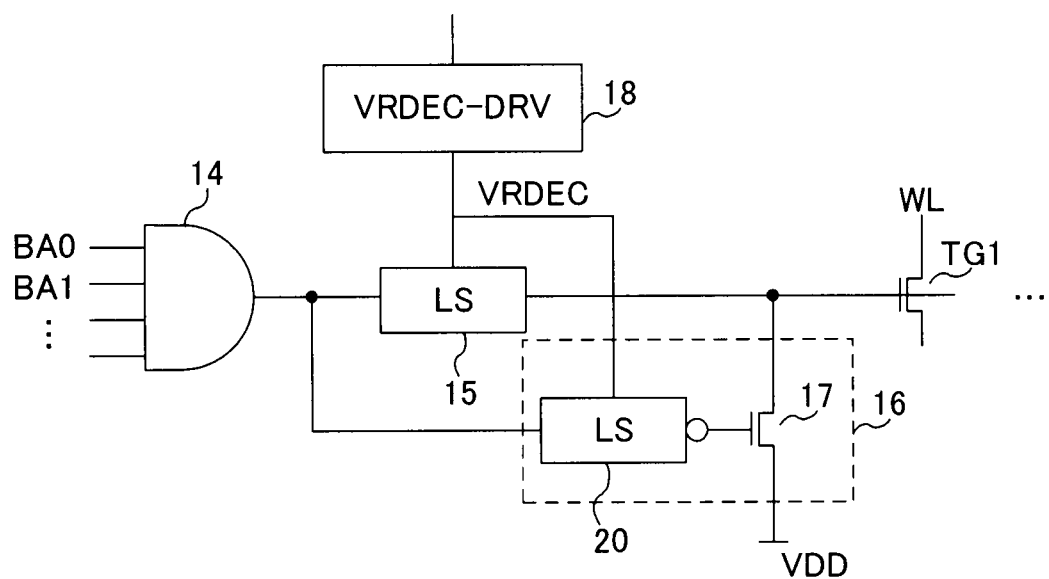
FIG. 3 is a circuit diagram of a constitution of a row decoder and a voltage control circuit included in a NAND flash memory of a second embodiment.

Next, a semiconductor memory device of a second embodiment is described in relation to the circuit diagram shown in FIG. 3. The semiconductor memory device of this embodiment is different from the semiconductor memory device of the first embodiment in terms of a connection relationship among the voltage control circuit, the block decoder and the transfer transistor driver. Otherwise the configuration of the semiconductor memory device of this embodiment is identical to that of the semiconductor memory device of the first embodiment. For this reason, detailed descriptions will be provided for only the voltage control circuit of this embodiment.

[Configuration of Semiconductor Memory Device]

As shown in FIG. 3, the voltage control circuit 16 has the voltage control transistor 17 as in the case of the first embodiment. The drain of this voltage control transistor 17 is commonly connected to the gates of the respective transfer transistors TT0 to TT7, TG1, TG2 and the output terminal of the level shifter 15. The source of the voltage control transistor 17 is connected to, for example, the power supply voltage Vdd, and the gate of the voltage control transistor 17 is connected to the output terminal of a level shifter 20 via an inverter. This level shifter 20 is different from the level shifter 15, and is supplied with a signal from the block decoder 14 and the high voltage VRDEC from the transfer transistor driver 18.

[Effects of Second Embodiment]

As described above, the semiconductor memory device of this second embodiment can make the difference in voltage between the gate and source of each transfer transistor in each unselected block lower than the semiconductor memory device provided with no voltage control circuit, in the same manner as the first embodiment. For this reason, the semiconductor memory device of the embodiment is also capable of reducing a threshold value variation which takes place in the transfer transistors due to hot carrier trapping. As a result, the semiconductor memory device of second the embodiment is also capable of preventing a malfunction of the transfer transistors, and of enhancing the reliability of the transfer transistors.

In the first embodiment, the control circuit 7 generates the internal timing signal for determining the voltage to be supplied to the gate of the voltage control transistor 17. In this second embodiment, however, a voltage is supplied to the gate of the voltage control transistor 17 on the basis of the signal from the block decoder 14. For this reason, the control circuit 7 of this embodiment no longer needs to generate the internal timing signal for determining the voltage to be supplied to the gate of the voltage control transistor 17. Accordingly, it is possible to reduce the consumed current.

Furthermore, this embodiment can enhance the reliability of the transfer transistors more easily than the first embodiment.

Third Embodiment

Next, descriptions will be provided for a semiconductor memory device of a third embodiment. The semiconductor memory device of this embodiment is different from the semiconductor memory devices of the respective first and second embodiments in terms of the voltage control circuit and the control method. When writing data, the semiconductor memory device of this embodiment connects the gates of the respective transfer transistors to the voltage control circuit only if the voltage to be applied to the output terminals CG exceeds a desired voltage value (a default value).

In the semiconductor memory device of this embodiment, the default value is held in a ROM (whose illustration is omitted) in the control circuit 7, unlike in the case of the semiconductor memory devices of the respective first and second embodiments.

With this taken into consideration, detailed descriptions will be provided for only the method of controlling the voltage control circuit of this embodiment.

[Method of Controlling Voltage Control Circuit]

When data is written, the control circuit 7 judges whether or not a program voltage to be applied to the word lines WL exceeds the default value. Before the data is written, the control circuit 7 accesses the ROM in the control circuit 7, and causes the default value to be read to a temporary storage device (whose illustration is omitted) in the control circuit 7. The control circuit 7 compares this default value with the program voltage. If the control circuit 7 judges that the program voltage exceeds the default value, the control circuit 7 outputs the internal timing signals to the row decoder 2, the voltage generator circuit 8 and the like. Thereby, the level of the high voltage VRDEC is converted, and the resultant voltage is supplied to the gates of the respective transfer transistors TT0 to TT7, TG1, TG2 in each selected block. On the other, the gates of the respective transfer transistors TT0 to TT7, TG1, TG2 in each unselected block are connected to the voltage control circuit 16. For example, the power supply voltage Vdd is transferred to the gates of the respective transfer transistors TT0 to TT7, TG1, TG2.

It should be noted that: the number of default values is not limited to one; and multiple default values may be established.

[Effects of Third Embodiment]

As described above, the semiconductor memory device of this third embodiment can make the difference in voltage between the gate and source of each transfer transistor in each unselected block lower than the semiconductor memory device provided with no voltage control circuit, in the same manner as the first embodiment. For this reason, the semiconductor memory device of the third embodiment is capable of reducing a threshold value variation which takes place in the transfer transistors due to hot carrier trapping. As a result, the semiconductor memory device of the third embodiment is capable of preventing a malfunction of the transfer transistors, and of enhancing the reliability of the transfer transistors.

Additionally, when the program voltage exceeds the default value in the ROM, the semiconductor memory device of this third embodiment converts the level of the high voltage VRDEC, and supplies the resultant voltage to the gates of the respective transfer transistors TT0 to TT7, TG1, TG2 in each selected block, as well as transfers, for example, the power supply voltage Vdd to the gates of the respective transfer transistors TT0 to TT7, TG1, TG2 in each unselected block. When data is written, this third embodiment no longer requires the internal timing signal to be outputted each time the program voltage is applied. As a result, it is possible to reduce the consumed current.

The invention disclosed herein is not limited to the foregoing embodiments, but may be modified variously within the scope of the appended claims without departing from the gist of the invention. Furthermore, the foregoing embodiments include various modes of the inventions, and various inventions can be extracted by combining multiple disclosed constituent features depending on necessity.

What is claimed is:

1. A semiconductor memory device comprising:
   a plurality of memory cell transistors provided in each block, and configured to be capable of holding data;
   a row decoder including transfer transistors, a voltage controller and a block selector in each block, the transfer transistors electrically connected to respective of the memory cell transistors, the voltage controller connected to gates of the respective transfer transistors and capable of transferring a desired voltage to the gates of the respective transfer transistors, the block selector electrically connected to gates of the respective transfer transistors and configured to select blocks;
   a voltage generator configured to generate the voltage to be supplied to the transfer transistors; and
   a controller configured to control the row decoder and the voltage generator, wherein
   when data is written, the gates of the respective transfer transistors are connected to the voltage controller in each non-selected block, and the gates of the respective transfer transistors are disconnected from the voltage controller in each selected block.

2. The semiconductor memory device of claim 1, wherein the voltage controller includes a voltage control transistor, a source of the voltage control transistor is connected to a power supply voltage, and a drain of the voltage control transistor is connected to the gates of the respective transfer transistors, and
   the controller switches the voltage control transistor on the basis of the selected block or the non-selected block.

3. The semiconductor memory device of claim 2, wherein a plurality of the voltage control transistors are provided in each block, and
   the controller turns off the voltage control transistor corresponding to the selected block, and turns on the voltage control transistor corresponding to the non-selected block.

4. The semiconductor memory device of claim 3, wherein when the data is written, the controller performs a control to disconnect the gates of the respective transfer transistors in the non-selected block from the block selector, and connect the gate of the respective transfer transistors in the selected block to the block selector.

5. The semiconductor memory device of claim 3, wherein the row decoder includes a block decoder and a first level shifter,
   the voltage controller includes a second level shifter and the voltage control transistor,
   an output terminal of the block decoder is connected to input terminals of the respective first and second level shifters,
   an output terminal of the first level shifter is connected to the gates of the respective transfer transistors,
   an output terminal of the second level shifter is connected to a gate of the voltage control transistor via an inverter, and the drain of the voltage control transistor is commonly connected to the output terminal of the first level shifter and the gates of the respective transfer transistors.

6. The semiconductor memory device of claim 5, wherein the row decoder further includes a transfer transistor driver, and an output terminal of the transfer transistor driver is commonly connected to input terminals of the respective first and second level shifters.

7. The semiconductor memory device of claim 2, wherein when the data is written, the controller performs a control to disconnect the gates of the respective transfer transistors in the non-selected block from the block selector, and connect the gate of the respective transfer transistors in the selected block to the block selector.

8. The semiconductor memory device of claim 7, wherein the row decoder further includes a shift register, the shift register is connected to an output terminal of the block selector, and the output terminal of the shift register is commonly connected to the drain of the voltage control transistor.

9. The semiconductor memory device of claim 7, wherein the row decoder includes a block decoder and a first level shifter, the voltage controller includes a second level shifter and the voltage control transistor, an output terminal of the block decoder is connected to input terminals of the respective first and second level shifters, an output terminal of the first level shifter is connected to the gates of the respective transfer transistors, an output terminal of the second level shifter is connected to a gate of the voltage control transistor via an inverter, and the drain of the voltage control transistor is commonly connected to the output terminal of the first level shifter and the gates of the respective transfer transistors.

10. The semiconductor memory device of claim 9, wherein the row decoder further includes a transfer transistor driver, and an output terminal of the transfer transistor driver is commonly connected to input terminals of the respective first and second level shifters.

11. The semiconductor memory device of claim 9, wherein when the data is written by stepping up a program voltage, the controller performs a control that such, if the program voltage exceeds a default value stored in the semiconductor memory device, the gates of the respective transfer transistors are connected to the voltage controller in each non-selected block, and the gates of the respective transfer transistors are disconnected from the voltage controller in each selected block.

12. The semiconductor memory device of claim 7, wherein when the data is written by stepping up a program voltage, the controller performs a control that such, if the program voltage exceeds a default value stored in the semiconductor memory device, the gates of the respective transfer transistors are connected to the voltage controller in each non-selected block, and the gates of the respective transfer transistors are disconnected from the voltage controller in each selected block.

13. The semiconductor memory device of claim 2, wherein the row decoder includes a block decoder and a first level shifter, the voltage controller includes a second level shifter and the voltage control transistor, an output terminal of the block decoder is connected to input terminals of the respective first and second level shifters, an output terminal of the first level shifter is connected to the gates of the respective transfer transistors, an output terminal of the second level shifter is connected to a gate of the voltage control transistor via an inverter, and the drain of the voltage control transistor is commonly connected to the output terminal of the first level shifter and the gates of the respective transfer transistors.

14. The semiconductor memory device of claim 2, wherein when the data is written by stepping up a program voltage, the controller performs such a control that, if the program voltage exceeds a default value stored in the semiconductor memory device, the gates of the respective transfer transistors are connected to the voltage controller in each non-selected block, and the gates of the respective transfer transistors are disconnected from the voltage controller in each selected block.

15. The semiconductor memory device of claim 1, wherein when the data is written, the controller performs a control to disconnect the gates of the respective transfer transistors in the non-selected block from the block selector, and connect the gate of the respective transfer transistors in the selected block to the block selector.

16. The semiconductor memory device of claim 15, wherein the row decoder includes a block decoder and a first level shifter, the voltage controller includes a second level shifter and a voltage control transistor, an output terminal of the block decoder is connected to input terminals of the respective first and second level shifters, an output terminal of the first level shifter is connected to the gates of the respective transfer transistors, an output terminal of the second level shifter is connected to a gate of the voltage control transistor via an inverter, and a drain of the voltage control transistor is commonly connected to the output terminal of the first level shifter and the gates of the respective transfer transistors.

17. The semiconductor memory device of claim 16, wherein the row decoder further includes a transfer transistor driver, and an output terminal of the transfer transistor driver is commonly connected to input terminals of the respective first and second level shifters.

18. The semiconductor memory device of claim 1, wherein when the data is written by stepping up a program voltage, the controller performs a control such that, if the program voltage exceeds a default value stored in the semiconductor memory device, the gates of the respective transfer transistors are connected to the voltage controller in each non-selected block, and the gates of the respective transfer transistors are disconnected from the voltage controller in each selected block.

* * * * *